(12) United States Patent
Shin et al.

(10) Patent No.: US 7,898,270 B2
(45) Date of Patent: Mar. 1, 2011

(54) CIRCUIT FOR TESTING INTERNAL VOLTAGE OF SEMICONDUCTOR MEMORY APPARATUS

(75) Inventors: Yoon-Jae Shin, Ichon (KR); Jee-Yul Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 19 days.

(21) Appl. No.: 12/169,524

(22) Filed: Jul. 8, 2008

(65) Prior Publication Data

US 2009/0091348 A1 Apr. 9, 2009

(30) Foreign Application Priority Data

Oct. 9, 2007 (KR) .................. 10-2007-0101568

(51) Int. Cl.
*G01R 31/26* (2006.01)
(52) U.S. Cl. ................................ 324/750.01
(58) Field of Classification Search ............. 324/158.1, 324/763–765; 365/201; 714/718–723
See application file for complete search history.

(56) References Cited

U.S. PATENT DOCUMENTS

| | | | |
|---|---|---|---|
| 6,298,001 B1 * | 10/2001 | Lee et al. .................. | 365/226 |
| 6,424,142 B1 * | 7/2002 | Kato et al. ................ | 324/158.1 |
| 6,472,897 B1 * | 10/2002 | Shyr et al. ................ | 324/765 |
| 6,507,183 B1 * | 1/2003 | Mulatti et al. ............ | 324/99 D |
| 6,535,447 B2 * | 3/2003 | Kim et al. ................. | 365/226 |
| 6,876,585 B2 | 4/2005 | Choi et al. | |
| 6,937,051 B2 * | 8/2005 | Eichin et al. ............. | 324/765 |
| 7,016,249 B2 | 3/2006 | Ross | |
| 7,034,567 B2 | 4/2006 | Jang | |
| 7,724,014 B2 * | 5/2010 | Gurevitch et al. ......... | 324/763 |

FOREIGN PATENT DOCUMENTS

| | | |
|---|---|---|
| JP | 2007-128632 | 5/2007 |
| KR | 1019950008438 | 7/1995 |
| KR | 1020040070615 A | 8/2004 |
| KR | 1020060011597 | 2/2006 |

* cited by examiner

*Primary Examiner*—Ha Tran T Nguyen
*Assistant Examiner*—Joshua Benitez
(74) *Attorney, Agent, or Firm*—Baker & McKenzie LLP

(57) ABSTRACT

An internal voltage test circuit of a semiconductor memory apparatus includes a comparing unit for comparing a level of internal voltage with a level of external voltage to output a comparison result as an output signal during a test mode, and an output selecting unit for outputting the output signal to a data output pad during the test mode, and outputting a data signal to the data output pad during a normal operation mode.

7 Claims, 2 Drawing Sheets

CIRCUIT FOR TESTING INTERNAL VOLTAGE OF SEMICONDUCTOR MEMORY APPARATUS

CROSS-REFERENCES TO RELATED APPLICATION

The present application claims priority under 35 U.S.C. 119(a) to Korean application number 10-2007-0101568, filed on Oct. 9, 2007, which is incorporated herein by reference in its entirety as if set forth in full.

BACKGROUND

1. Technical Field

The embodiments described herein relate to a semiconductor memory apparatus. More particularly, the embodiments described herein relate to an internal voltage testing circuit.

2. Related Art

A Conventional semiconductor memory apparatus receives external voltage to generate desired voltage having a predetermined level. At this time, the voltage generated in the semiconductor memory apparatus is referred to as internal voltage.

During a test mode, an internal voltage generation circuit generates the internal voltage according to a level of external reference voltage. If the test mode is completed, the internal voltage generation circuit generates the internal voltage according to a level of internal reference voltage.

In a semiconductor memory apparatus having the internal voltage generation circuit as described above, it is possible to monitor a level of the internal voltage, which is generated according to the level of the external reference voltage, in a test step prior to a packaging step. After the test step, the internal voltage generation circuit detects a level of external reference voltage, which allows the internal voltage to have a target level, and fixes the detected external reference voltage level as a level of internal reference voltage.

After packaging the semiconductor memory apparatus, it is impossible to monitor levels of the internal voltage and the internal reference voltage generated in the semiconductor memory apparatus. Thus, if the semiconductor memory apparatus has been packaged, it is difficult to analyze and solve the problems caused by the failure of the internal voltage.

SUMMARY

An internal voltage test circuit of a semiconductor memory apparatus, in which it is possible to monitor the level of voltage generated in the semiconductor memory apparatus after packaging the semiconductor memory apparatus, is described herein.

In one aspect, an internal voltage test circuit of the semiconductor memory apparatus includes a comparing unit for comparing a level of internal voltage with a level of external voltage to output a comparison result as an output signal during test mode, and an output selecting unit for outputting the output signal to a data output pad during the test mode, and outputting a data signal to the data output pad during normal operation mode.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
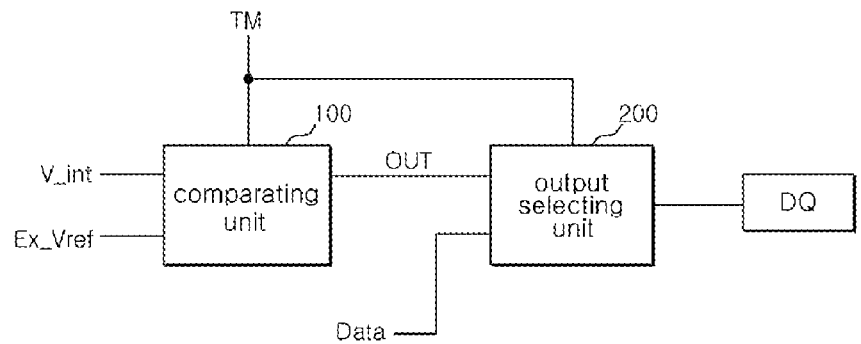
FIG. 1 is a block diagram illustrating an internal voltage test circuit of a semiconductor memory apparatus according to one embodiment.

As illustrated in FIG. 1, an internal voltage test circuit of a semiconductor memory apparatus according to one embodiment can be configured to include a comparing unit 100 and an output selecting unit 200.

The comparing unit 100 can be activated when a test signal 'TM' is enabled. The activated comparing unit 100 can generate an output signal 'OUT' by comparing the level of internal voltage V_int with the level of external reference voltage Ex_Vref. The internal voltage V_int can be generated in the semiconductor memory apparatus, and the external reference voltage Ex_Vref can be applied to the semiconductor memory apparatus from an exterior thereof.

Figure 2:
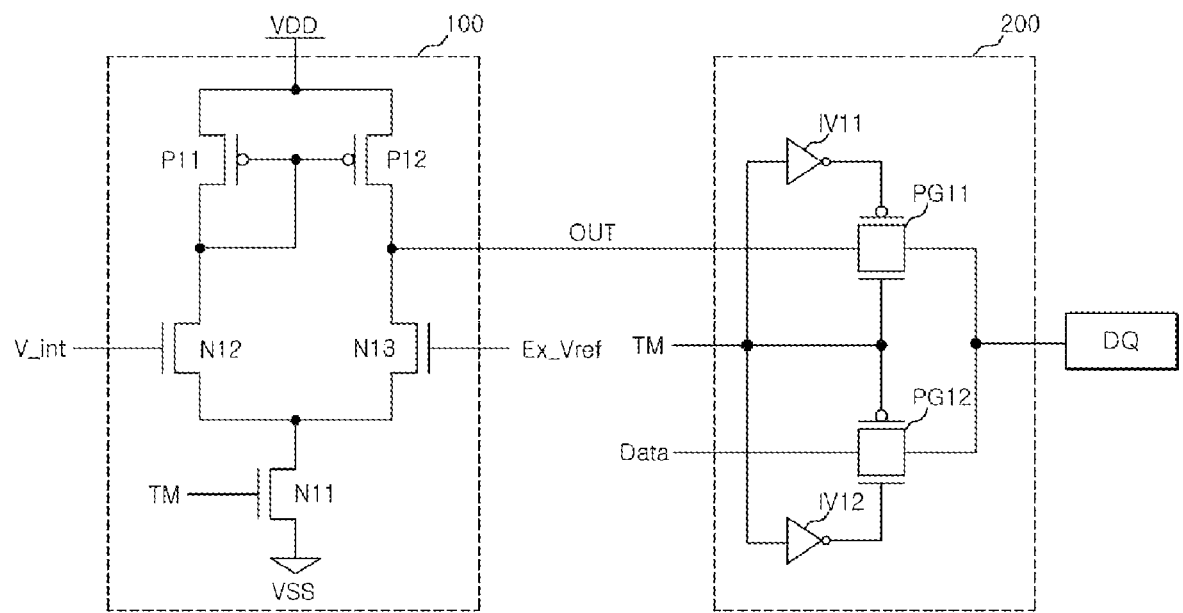
FIG. 2 is a detailed circuit diagram illustrating an internal voltage test circuit of a semiconductor memory apparatus according to one embodiment.

As illustrated in FIG. 2, the comparing unit 100 can be configured to include first to fifth transistors N11, N12, N13, P11 and P12. The first transistor N11 can have a gate terminal, which receives the test signal 'TM,' and a source terminal connected with the ground VSS. The second transistor N12 can have a gate terminal, which receives the internal voltage V_int, and a source terminal connected with a drain terminal of the first transistor N11. The third transistor N13 can have a gate terminal, which receives the external reference voltage Ex_Vref, and a source terminal connected with the drain terminal of the first transistor N11. The fourth transistor P11 can have gate and drain terminals, which are connected with a drain terminal of the second transistor N12, and a source terminal that receives external voltage VDD. The fifth transistor P12 can have a gate terminal connected with a gate terminal of the fourth transistor P11, a drain terminal connected with a drain terminal of the third transistor N13, and a source terminal that receives the external voltage VDD. At this time, the output signal 'OUT' can be output from a node connected with the third and fifth transistors N13 and P12.

When the test signal 'TM' is enabled, the output selecting unit 200 can be configured to output the output signal 'OUT' to a data output pad DQ. When the test signal 'TM' is disabled, the output selecting unit 200 can output a data signal 'DATA' to the data output pad DQ.

As illustrated in FIG. 2, the output selecting unit 200 can be configured to include first and second inverters IV11 and IV12, and first and second pass gates PG11 and PG12. The first inverter IV11 can be configured to receive the test signal 'TM.' The first pass gate PG11 can have an input terminal, which receives the output signal 'OUT', a first control terminal, which receives output of the first inverter IV11, a second control terminal, which receives the test signal 'TM,' and an output terminal connected with the data output pad DQ. The second inverter IV12 can be configured to receive the test signal 'TM.' The second pass gate PG12 can have an input terminal, which receives the data signal 'DATA,' a first control terminal, which receives the test signal 'TM,' a second control terminal, which receives output of the second inverter IV12, and an output terminal connected with the data output pad DQ.

Hereinafter, an operation of the internal voltage test circuit of the semiconductor memory apparatus according to one embodiment will be described.

During a test mode, when the test signal 'TM' is enabled at a high level, the first transistor N11 can be turned on so that the comparing unit 100 is activated. Further, when the test signal 'TM' is enabled at a high level, the first pass gate PG11 can be turned on, so that the output signal 'OUT' of the comparing unit 100 can be output to the data output pad DQ. The comparing unit 100 can compare the level of the external reference voltage Ex_Vref with the level of the internal voltage V_int, thereby outputting a comparison result as the output signal 'OUT.'

The external reference voltage Ex_Vref can be applied to the semiconductor memory apparatus through an input pin and has various levels. The internal voltage V_int can be generated in the semiconductor memory apparatus. The internal voltage test circuit can compare a voltage level of the internal voltage V_int and a voltage level of the external reference voltage Ex_Vref while changing the external reference voltage Ex_Vref from high voltage to low voltage. Further, the external reference voltage Ex_Vref can, depending on the embodiment, vary from low voltage to high voltage.

If the internal voltage V_int has a level lower than that of the external reference voltage Ex_Vref, the output signal 'OUT' becomes a low level. However, if the internal voltage V_int has a level higher than that of the external reference voltage Ex_Vref, the output signal 'OUT' becomes a high level.

During a normal operation mode, other than the test mode, when the test signal 'TM' becomes a low level, the first transistor N11 can be turned off, so that the comparing unit 100 is deactivated. Further, the second pass gate PG12 of the output selecting unit 200 can be turned on by the test signal 'TM' at a low level, thereby outputting the data signal 'DATA' to the data output pad DQ. The data signal 'DATA' can be outputted through a general read operation of the semiconductor memory apparatus during the normal operation mode.

During the test mode, the internal voltage test circuit of one embodiment can be configured to detect the time point, at which the voltage level of the output signal 'OUT' is shifted from a low level to a high level, by changing the level of the external reference voltage Ex_Vref. At this time, the time point, at which the voltage level of the output signal 'OUT' is shifted from the low level to the high level or from the high level to the low level, corresponds to the time point at which the internal voltage V_int has a level identical to that of the external reference voltage Ex_Vref. Thus, after packaging the semiconductor memory apparatus, it is possible to exactly measure the level of the internal voltage V_int based on the time point at which the level of the output signal 'OUT' is shifted.

Figure 3:
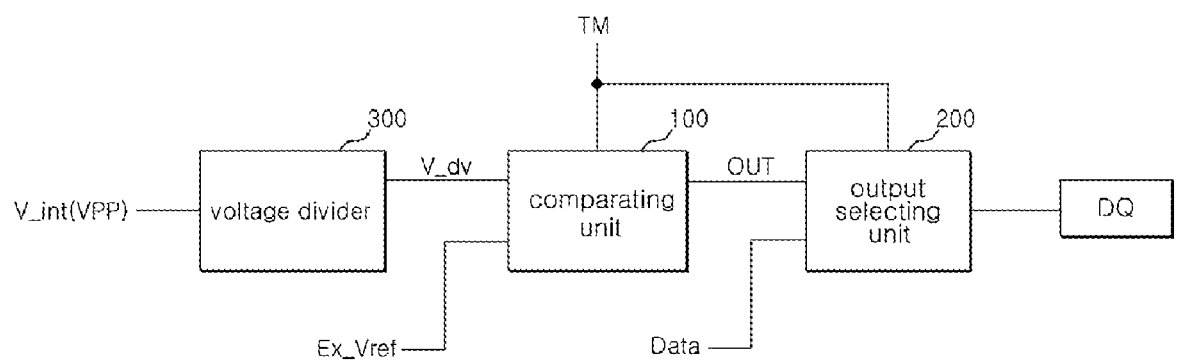
FIG. 3 is a block diagram illustrating an internal voltage test circuit of a semiconductor memory apparatus according to another embodiment.

As illustrated in FIG. 3, an internal voltage test circuit of a semiconductor memory apparatus according to another embodiment can be configured to include a comparing unit 100, an output selecting unit 200 and a voltage divider 300. When internal voltage V_int to be tested has a high level of similarly to pumping voltage VPP, the internal voltage test circuit can be provided according to another embodiment. Hereinafter, the following description will be given on an assumption that the internal voltage V_int is the pumping voltage VPP.

The voltage divider 300 can be configured to generate divided voltage V_dv by dividing the internal voltage V_int. The voltage divider 300 can be a used circuit, and includes a plurality of resistors serially interconnected. The voltage divider 300 has one end, to which the internal voltage V_int can be applied, and the other end connected with the ground. Further, the divided voltage V_dv can be outputted from one node among the resistors.

The comparing unit 100 can be activated when the test signal 'TM' is enabled. The activated comparing unit 100 generates an output signal 'OUT' by comparing a level of the divided voltage V_dv with a level of external reference voltage Ex_Vref applied from the exterior. At this time, when the divided voltage V_dv has a level lower than that of the external reference voltage Ex_Vref, the comparing unit 100 outputs an output signal 'OUT' at a low level. However, when the divided voltage V_dv has a level higher than that of the external reference voltage Ex_Vref, the comparing unit 100 outputs an output signal 'OUT' at a high level.

When the test signal 'TM' is enabled, the output selecting unit 200 outputs the output signal 'OUT' to a data output pad DQ. However, when the test signal 'TM' is disabled, the output selecting unit 200 outputs a data signal 'DATA' to the data output pad DQ. Further, the comparing unit 100 and the output selecting unit 200 may have the same construction as those of the comparing unit 100 and the output selecting unit 200 shown in FIG. 2.

The internal voltage test circuit of the semiconductor memory apparatus according to another embodiment operates as follows:

A description will be given on the assumption that the voltage divider 300 outputs the divided voltage V_dv having a level corresponding to ½ of that of the internal voltage V_int.

During a test mode, when the divided voltage V_dv has a level lower than that of the external reference voltage Ex_Vref, the comparing unit 100 outputs the output signal 'OUT' at a low level. However, when the divided voltage V_dv has a level higher than that of the external reference voltage Ex_Vref, the comparing unit 100 outputs the output signal 'OUT' at a high level.

During the test mode, the output selecting unit 200 outputs the output signal 'OUT' to the data output pad DQ. Thus, the packaged semiconductor memory apparatus outputs the output signal 'OUT' to the exterior.

Further, during the test mode, it is possible to monitor change in the level of the output signal 'OUT' while varying the level of the external reference voltage Ex_Vref. During test mode, if the level of the output signal 'OUT' is changed from high to low or from low to high, the level of the external reference voltage Ex_Vref is checked at the time point at which the voltage level of the output signal 'OUT' is shifted. If the external reference voltage Ex_Vref has a level of 0.8V at the time point at which the voltage level of the output signal 'OUT' is shifted, it can be estimated that the internal voltage V_int to be tested has a level of 1.6V.

Figure 4:
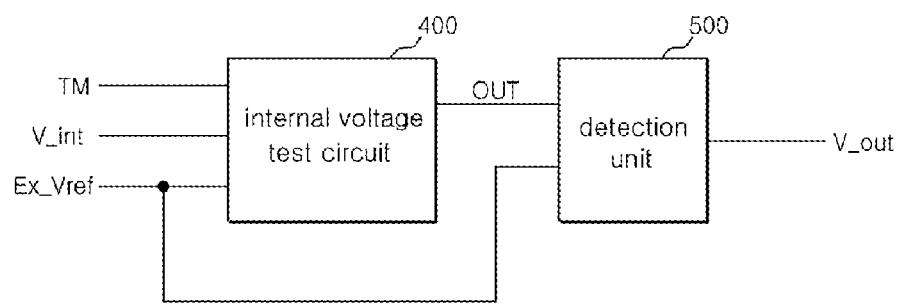
FIG. 4 is a block diagram illustrating a semiconductor memory apparatus using an internal voltage test circuit according to one embodiment.

As illustrated in FIG. 4, the semiconductor memory apparatus using the internal voltage test circuit according to one embodiment can be configured to include the internal voltage test circuit 400 and a detection unit 500.

The internal voltage test circuit 400 can be activated when the test signal 'TM' is enabled. The activated internal voltage test circuit 400 generates the output signal 'OUT' by comparing the level of the internal voltage V_int with the level of external reference voltage Ex_Vref. For example, when the internal voltage V_int has a level lower than that of the external reference voltage Ex_Vref, the internal voltage test circuit 400 outputs the output signal 'OUT' at a low level. However, when the internal voltage V_int has a level higher than that of the external reference voltage Ex_Vref, the internal voltage test circuit 400 outputs the output signal 'OUT' at a high level.

The detection unit 500 outputs the external reference voltage Ex_Vref as output voltage V_out at the timing at which the level of the output signal 'OUT' is shifted.

The semiconductor memory apparatus using the internal voltage test circuit of one embodiment operates as follows.

The external reference voltage Ex_Vref can be applied to the semiconductor memory apparatus from the exterior thereof and has various levels. Thus, during the test mode, the level of the external reference voltage Ex_Vref can be increased from low voltage.

When the external reference voltage Ex_Vref, a level of which increases, has a level lower than that of the internal voltage V_int, the internal voltage test circuit 400 outputs the output signal 'OUT' at a low level. However, when the external reference voltage Ex_Vref has a level higher than that of the internal voltage V_int, the internal voltage test circuit 400 outputs the output signal 'OUT' at a high level.

The detection unit 500 can be configured to output the external reference voltage Ex_Vref as the output voltage V_out at the timing at which the output signal 'OUT' is shifted from a low level to a high level. The timing, at which the output signal 'OUT' is shifted from a low level to a high level, represents the time point at which the external reference voltage Ex_Vref has a level identical to that of the internal voltage V_int. Accordingly, the output voltage V_out has a level identical to that of the internal voltage V_int.

As described above, the internal voltage test circuit of the semiconductor memory apparatus according to one embodiment can be configured to monitor a level of voltage generated after packaging the semiconductor memory apparatus, thereby reducing time required for testing the semiconductor memory apparatus.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. An internal voltage test circuit of a semiconductor memory apparatus, the internal voltage test circuit comprising:

a comparing unit configured to compare a level of internal voltage with a level of external voltage to output a comparison result as an output signal when a test signal is enabled; and an output selecting unit configured to output the output signal of the comparing unit to a data output pad when the test signal is enabled, and output a data signal to the data output pad when the test signal is disabled, wherein the output selecting unit includes:

a first pass gate having an input terminal, which is configured to receive the output signal, a first control terminal, which is configured to receive an inverted test signal, and a second control terminal that is configured to receive the test signal; and a second pass gate having an input terminal, which is configured to receive the data signal, a first control terminal, which is configured to receive the test signal, and a second control terminal that is configured to receive the inverted test signal.

2. The internal voltage test circuit of claim 1, wherein the comparing unit is further configured to output the output signal at a first level if the internal voltage has a level higher than the level of the external voltage when the test signal is enabled.

3. The internal voltage test circuit of claim 2, wherein the comparing unit is further configured to output the output signal at a second level if the internal voltage has a level lower than the level of the external voltage when the test signal is enabled.

4. The internal voltage test circuit of claim 3, wherein the second level of the output signal is identical to a level obtained by inverting the output signal at the first level.

5. The internal voltage test circuit of claim 1, wherein the output selecting unit is further configured to output the output signal to the data output pad when the test signal is enabled.

6. The internal voltage test circuit of claim 5, wherein the output selecting unit is further configured to output the data signal to the data output pad when the test signal is disabled.

7. The internal voltage test circuit of claim 1, further comprising a voltage divider configured to apply voltage, which is obtained by dividing the internal voltage, to the comparing unit.

* * * * *